United States Patent [19]

Furuyama

[11] Patent Number: 5,383,160
[45] Date of Patent: Jan. 17, 1995

[54] DYNAMIC RANDOM ACCESS MEMORY

[75] Inventor: Tohru Furuyama, Tokyo, Japan

[73] Assignee: Kabushiki Kaisha Toshiba, Kawasaki, Japan

[21] Appl. No.: 187,517

[22] Filed: Jan. 28, 1994

[30] Foreign Application Priority Data

Jan. 28, 1993 [JP] Japan .................. 5-012734

[51] Int. Cl.⁶ .............................. G11C 13/00
[52] U.S. Cl. .................... 365/221; 365/210; 365/230.01
[58] Field of Search .............. 365/210, 221, 230.01

[56] References Cited

U.S. PATENT DOCUMENTS 5,317,540  5/1994  Furuyama ............. 365/230.01

OTHER PUBLICATIONS

Kimura et al., "A Block-Oriented RAM with Half-Sized DRAM Cell and Quasi-Folded Data-Line Architecture" *ISSC91*, Feb. 1991.

*Primary Examiner*—Eugene R. LaRoche
*Assistant Examiner*—F. Niranjan
*Attorney, Agent, or Firm*—Banner, Birch, McKie & Beckett

[57] ABSTRACT

A DRAM includes a memory cell array having cascade-connected type memory cells arranged in a matrix form and each capable of storing plural-bit information in the unit of bit, sense amplifiers each arranged for a preset number of columns in the memory cell array and disposed in the central portion of the bit lines of the preset number of columns in the arrangement direction, switching circuits disposed on both sides of each of the sense amplifiers, for electrically and selectively connecting the preset number of columns to the sense amplifier, an address designation circuit for separately and serially designating addresses of a plurality of memory cells disposed on both sides of the sense amplifier in the same column of the memory cell array, a word line driving circuit for selectively driving a word line connected to a memory cell of an address designated by the address designation circuit, a column selection circuit for effecting the column selection of the memory cell array, and an access control circuit for time-serially reading out plural-bit information from one of the memory cells storing storage information and lying on one side of the sense amplifier and sequentially rewriting the plural-bit information into one of the memory cells lying on the other side of the sense amplifier and set in a non-use state at the time of serial access to a plurality of memory cells in a desired column of the memory cell array.

20 Claims, 12 Drawing Sheets

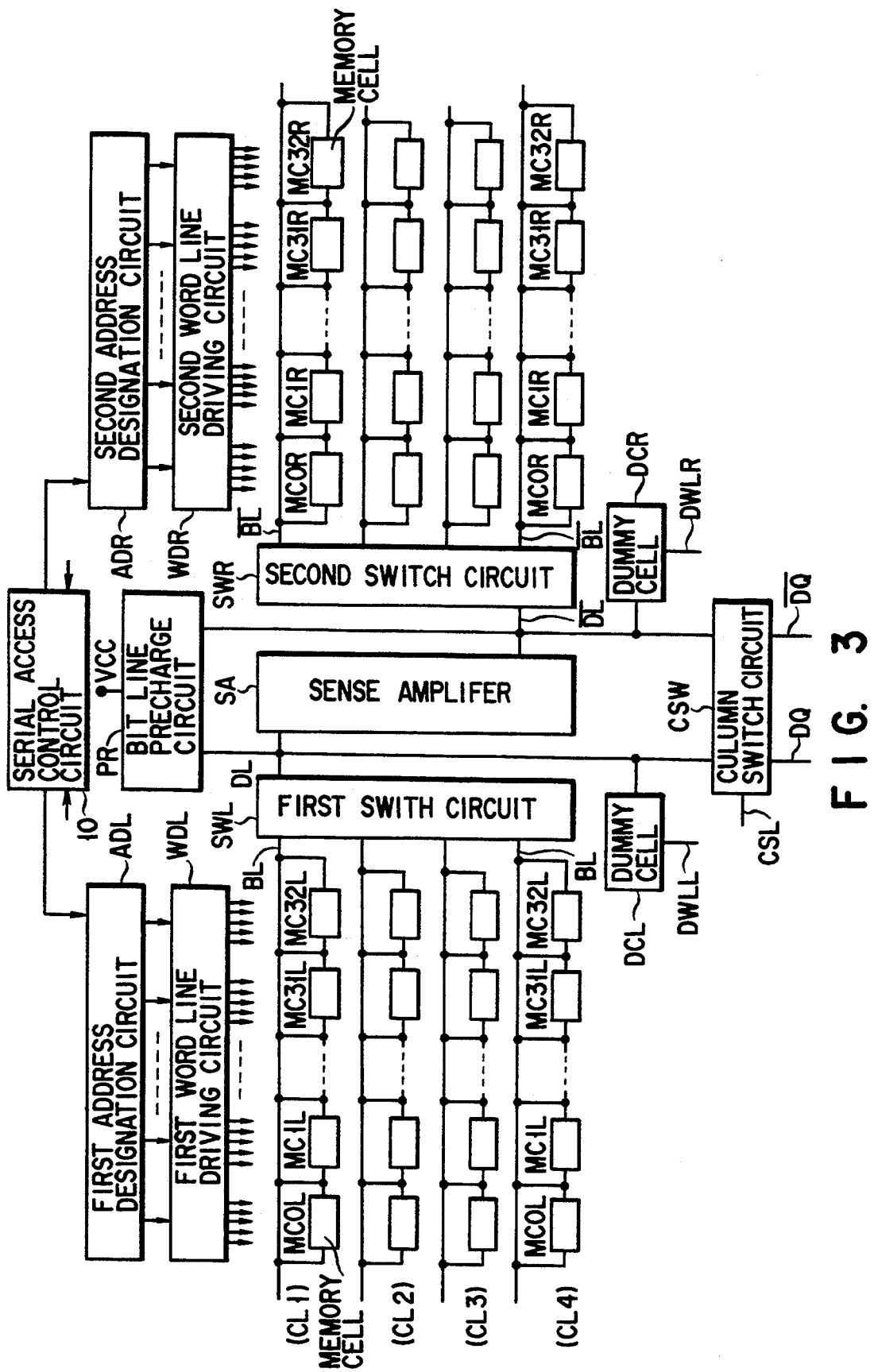
F I G. 3

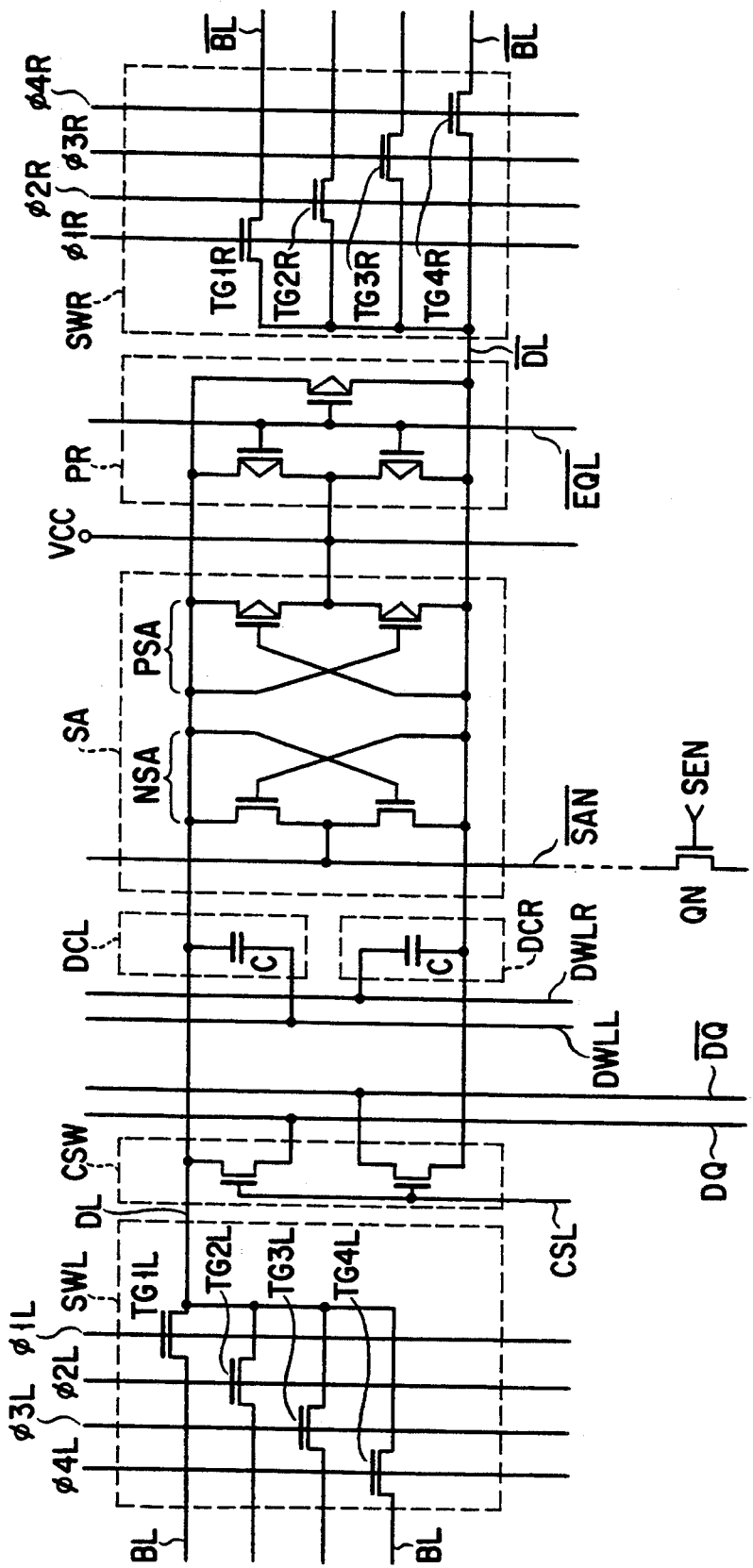
F I G. 4

| | | |
|---|---|---|
| FIRST SERIAL ACCESS | WL0L0 ON~WL32R4 OFF | (MC0L READOUT, MC32R STORAGE) |
| | WL0R0 ON~WL0L4 OFF | (MC0R READOUT, MC0L4 STORAGE) |
| DUMMY CYCLE | WL31R0 ON~WL31L4 OFF | (MC31R READOUT, MC31L STORAGE) |
| | WL31L1~4 ON, OTHER WORD LINES OFF | |
| SECOND SERIAL ACCESS | WL32R0 ON WL32L4 OFF | (MC32L READOUT, MC32L STORAGE) |
| | WL0L0 ON WL32R4 OFF | (MC0L READOUT, MC32R STORAGE) |
| DUMMY CYCLE | WL31IL0 ON WL30R4 OFF | (MC31L READOUT MC30R STORAGE) |
| | WL31IR1~4 ON, OTHER WORD LINES OFF | |
| THIRD SERIAL ACCESS | WL32L0 ON WL31R4 OFF | (MC32L READOUT, MC31R STORAGE) |
| | WL32R0 ON WL32L4 OFF | (MC32R READOUT, MC32L STORAGE) |
| DUMMY CYCLE | WL30R0 ON WL30L4 OFF | (MC30R READOUT, MC30L STORAGE) |
| | WL0R1~4 ON, OTHER WORD LINES OFF | |
| --- | | |
| SIXTY-FIFTH SERIAL ACCESS | WL1L0 ON WL0R4 OFF | (MC1L READOUT, MC0R STORAGE) |
| | WL1R0 ON WL1L4 OFF | (MC1R READOUT, MC1L STORAGE) |
| DUMMY CYCLE | WL32R0 ON WL32L4 OFF | (MC32R READOUT, MC32L STORAGE) |
| | WL1L0~4 ON, OTHER WORD LINES OFF | |
| SIXTY-SIXTH SERIAL ACCESS | WL0R0 ON WL0L4 OFF | (MC0R READOUT, MC0L STORAGE) |
| | WL1L0 ON WL0R4 OFF | (MC1L READOUT, MC0R STORAGE) |
| DUMMY CYCLE | WL32L0 ON WL31R4 OFF | (MC32L READOUT, MC31R STORAGE) |
| | WL32R1~4 ON, OTHER WORD LINES OFF | |
| RETURN TO FIRST SERIAL ACCESS | | |

FIG. 7

| FIRST SERIAL ACCESS (1024 BITS) | | | |
|---|---|---|---|
| TIME | | | |
| t0 | WL0L0 ON | $\begin{cases}(1,0L,C1)\\(2,0L,C1)\\(3,0L,C1)\\(4,0L,C1)\end{cases}$ | READOUT (4 COLUMN) |
| | WL32R1 OFF | $\begin{cases}(1,32R,C1)\\(2,32R,C1)\\(3,32R,C1)\\(4,32R,C1)\end{cases}$ | STORAGE (4 COLUMN) |
| | WL0L1 ON | (1~4,0L,C2) | READOUT |
| | WL32R2 OFF | (1~4,32R,C2) | STORAGE |
| | WL0L2 ON | (1~4,0L,C3) | READOUT |
| | WL32R3 OFF | (1~4,32R,C3) | STORAGE |
| | WL0L3 ON | (1~4,0L,C4) | READOUT |
| | WL32R4 OFF | (1~4,32R,C4) | STORAGE |
| | WL0L0 OFF, WL0L4 ON | | |
| t1 | WL0R0 ON | (1~4,0R,C1) | READOUT |
| | WL0L1 OFF | (1~4,0R,C1) | STORAGE |
| | ⋮ | | |
| | WL0R3 ON | (1~4,0R,C4) | READOUT |
| | WL0L4 OFF | (1~4,0L,C4) | STORAGE |
| | WL0R0 OFF, WL0R4 ON | | |
| | ⋮ | | |
| t64 | WL31R0 ON | (1~4,31R,C1) | READOUT |
| | ⋮ | | |
| | WL31L4 OFF | (1~4,31L,C4) | STORAGE |
| | WL31R0 OFF, WL31R4 ON | | |
| t65 | WL31R1 4 OFF, WL32L1 4 ON, WL32L0 OFF (DUMMY CYCLE) | | |

Right-side brackets:
- t0 to before t1: READOUT/STORAGE OF 16 BITS
- t1 region: READOUT/STORAGE OF 16 BITS
- t64 region: READOUT/STORAGE OF 16 BITS

FIG. 8

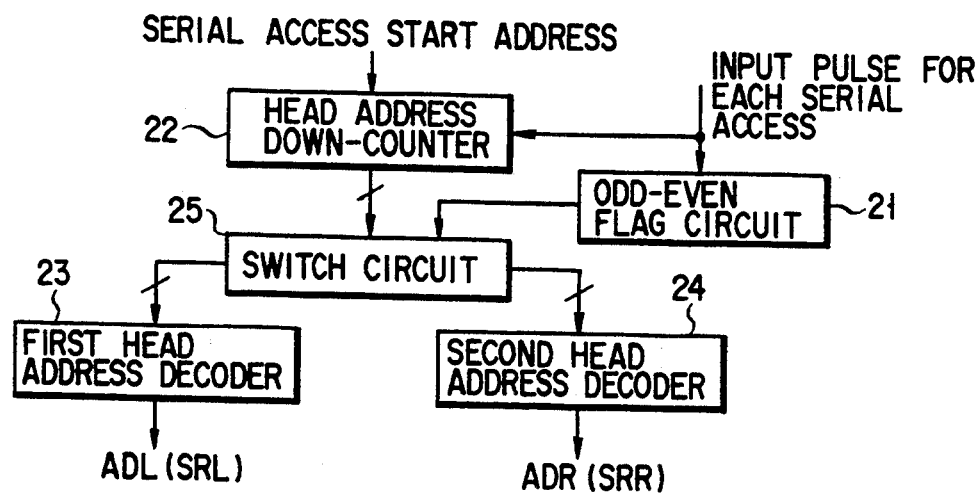
F I G. 12
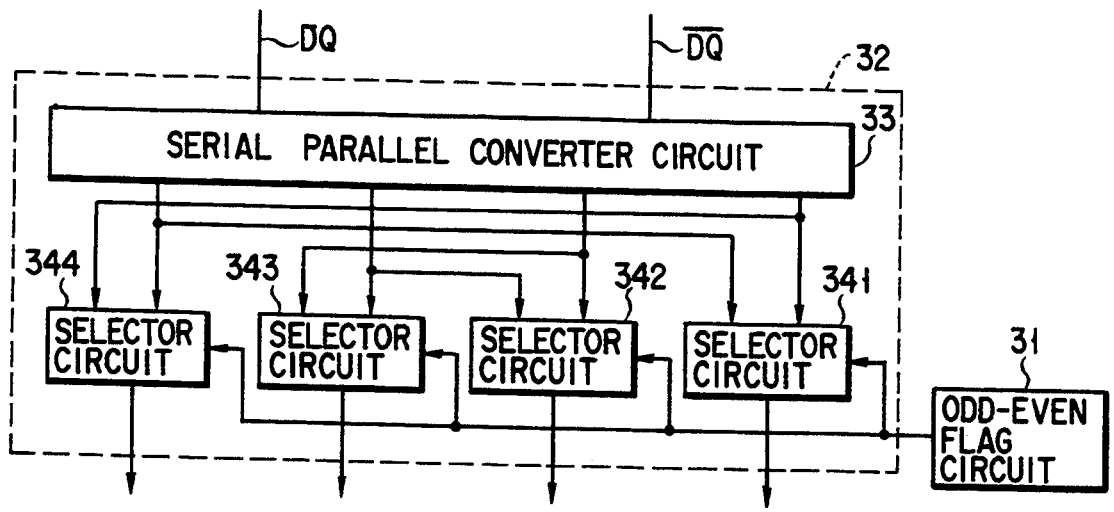
F I G. 13
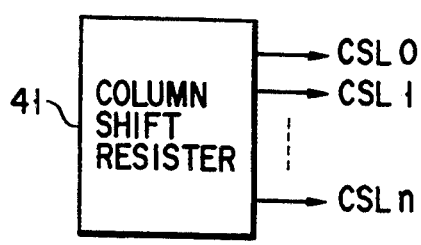
F I G. 14A
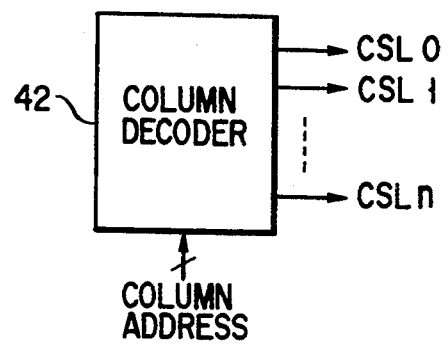
F I G. 14B

DYNAMIC RANDOM ACCESS MEMORY

BACKGROUND OF THE INVENTION

1. Field of the Invention

This invention relates to a semiconductor memory device, and more particularly to a dynamic random access memory (DRAM) having a cascade-connected type memory cell array capable of storing plural-bit information in the unit of bit.

2. Description of the Related Art

A DRAM cell which is now practically used has one MOS transistor used as a transfer gate and connected to a word line and a bit line and one capacitor connected to the transistor for information storage.

By taking into consideration the fact that it is required to enhance the integration density of the DRAM cells and reduce the cost for one bit, the inventor of this application proposed a cascade-connected type memory cell having such a construction as shown in FIGS. 1A, 2A, for example, and storing plural-bit information in the unit of bit and time-sequentially reading out the same (U.S. application Ser. No. 07/687,687) (JAPANESE PATENT APPLICATION No. H.2-104576).

In FIG. 1A, the memory cell includes three or more (in this example, five) MOS transistors Q1 to Q5 cascade-connected between a first node N1 and a second node N2, and a plurality of capacitors C1 to C4 for information storage which are connected at one end to the respective connection nodes between the cascade-connected MOS transistors.

The gates of the MOS transistors Q1 to Q5 are connected to respective word lines WL1 to WL5 of the memory cell array and the other ends of the capacitors C1 to C4 are commonly connected to a capacitor wiring 11 of the memory cell array (in this example, the capacitor wiring 11 is set to a plate potential VPL).

Further, the first node N1 and the second node N2 are commonly connected to a bit line BL of the memory cell array.

In the drawing, PR denotes a bit line precharge circuit connected to the bit line BL, 12 denotes a sense amplifier for sensing and amplifying the potential of the bit line BL, and 13 denotes a write circuit for setting the potential of the bit line BL according to write data.

Next, one example of the readout operation and the write operation of the DRAM cell of FIG. 1A is explained with reference to the timing waveform diagram of FIG. 1B.

The ON/OFF states of the word lines WL1 to WL5 are controlled at the timings shown in FIG. 1B to render the transistors Q1 to Q5 conductive in this order and then render the transistors Q1 to Q5 non-conductive in this order.

That is, when the word line WL1 is set into the ON state at the time t1 after the bit line BL is precharged to a preset potential by the bit line precharge circuit PR, the transistor Q1 is turned on to permit storage information of the capacitor C1 to be read out to the bit line BL via the transistor Q1 and sensed and amplified by the sense amplifier 12.

Next, when the word line WL2 is set into the ON state at the time t2 after the bit line BL is precharged again for a preset period of time, the transistor Q2 is turned on to permit storage information of the capacitor C2 to be read out to the bit line BL via the transistors Q2 and Q1.

Then, when the word line WL3 is set into the ON state at the time t3 after the bit line BL is precharged again, the transistor Q3 is turned on to permit storage information of the capacitor C3 to be read out to the bit line BL via the transistors Q3 to Q1.

Next, when the word line WL4 is set into the ON state at the time t4 after the bit line BL is precharged again, the transistor Q4 is turned on to permit storage information of the capacitor C4 to be read out to the bit line BL via the transistors Q4 to Q1.

After this, the word line WL1 is set into the OFF state to turn off the transistor Q1 and the word line WL5 is set into the ON state to turn on the transistor Q5 (the order of the operations may be reversed).

Next, when the word line WL2 is set into the OFF state at the time t5, the transistor Q2 is turned off to permit information (write data set by the write circuit 13) of the second node N2 to be written into the capacitor C1.

Next, when the word line WL3 is set into the OFF state at the time t6, the transistor Q3 is turned off to permit information of the node N2 to be written into the capacitor C2.

Next, when the word line WL4 is set into the OFF state at the time t7, the transistor Q4 is turned off to permit information of the node N2 to be written into the capacitor C3.

Next, when the word line WL5 is set into the OFF state at the time t8, the transistor Q5 is turned off to permit information of the node N2 to be written into the capacitor C4.

As is understood from the above explanation for the operation, according to the cascade-connected type cell of FIG. 1A, capacitor storage information can be read out to the first mode N1 in an order from the capacitor C1 which lies in the position near the first node N1 to the capacitor C4 which lies in the position farther from the node N1 by controlling the ON/OFF states of the transistors Q1 to Q5 in a preset order.

Further, information of the second node N2 can be written in an order from the capacitor C1 which lies in the position near the first node N1 to the capacitor C4 which lies in the position farther from the node N1 by controlling the ON/OFF states of the transistors Q1 to Q5 in a preset order.

A memory cell shown in FIG. 2A is connected at one end to a first node N1 for read/write and includes a cascade gate constructed by a plurality of (for example, four) first MOS transistors Q1 to Q4 cascade-connected and a plurality of information storing capacitors C1 to C4 which are each connected at one end to one of two ends of a corresponding one of the MOS transistors Q1 to Q4 which lies farther from the node N1.

The gates of the MOS transistors Q1 to Q4 are respectively connected to word lines WL1 to WL4 of the memory cell array and the node N1 is connected to a bit line BL of the memory cell array. PR denotes a bit line precharge circuit, 12 denotes a sense amplifier and 13 denotes a write circuit.

Next, one example of the readout operation and the write operation of the cascade-connected type DRAM cell of FIG. 2A is explained with reference to the timing waveform diagram of FIG. 2B.

The ON/OFF states of the word lines WL1 to WL4 are controlled at the timings shown in FIG. 2B to render the transistors Q1 to Q4 conductive in this order and then render the transistors Q4 to Q1 non-conductive in this order.

That is, when the word line WL1 is set into the ON state at the time t1 after the bit line BL is precharged to a preset potential by the bit line precharge circuit PR, the transistor Q1 is turned on to permit storage information of the capacitor C1 to be read out to the bit line BL via the transistor Q1 and sensed and amplified by the sense amplifier 12.

Next, when the word line WL2 is set into the ON state at the time t2 after the bit line BL is precharged again for a preset period of time, the transistor Q2 is turned on to permit storage information of the capacitor C2 to be read out to the bit line BL via the transistors Q2 and Q1.

Then, when the word line WL3 is set into the ON state at the time t3 after the bit line BL is precharged again, the transistor Q3 is turned on to permit storage information of the capacitor C3 to be read out to the bit line BL via the transistors Q3 to Q1.

Next, when the wordline WL4 is set into the ON state at the time t4 after the bit line BL is precharged again, the transistor Q4 is turned on to permit storage information of the capacitor C4 to be read out to the bit line BL via the transistors Q4 to Q1.

After this, when the word line WL4 is set into the OFF state at the time t5 to turn off the transistor Q4, information (write data set by the write circuit 13) of the bit line BL is written into the capacitor C4.

Next, when the word line WL3 is set into the OFF state at the time t6, the transistor Q3 is turned off to permit information of the bit line BL to be written into the capacitor C3.

Next, when the word line WL2 is set into the OFF state at the time t7, the transistor Q2 is turned off to permit information of the bit line BL to be written into the capacitor C2.

Next, when the word line WL1 is set into the OFF state at the time t8, the transistor Q1 is turned off to permit information of the bit line BL to be written into the capacitor C1.

As is understood from the above explanation for the operation, according to the cascade-connected type cell of FIG. 2A, capacitor storage information can be read out to the first node N1 in an order from the capacitor C1 which lies in the position near the first node N1 to the capacitor C4 which lies in the position farther from the node N1 by controlling the ON/OFF states of the transistors Q1 to Q4 in a preset order.

Further, information of the first node N1 can be written into the capacitors in an order from the capacitor C4 which lies in the position farther from the first node N1 to the capacitor C1 which lies in the position near the node N1 by controlling the ON/OFF states of the transistors Q1 to Q4 in a preset order.

Further, the cascade-connected type cells shown in FIGS. 1A, 2A can be formed with a higher integration density than a conventional DRAM using one-transistor/one-capacitor cells by use of the existing manufacturing process or without using a fine patterning technique in a modified manufacturing process, and therefore, the cost for one bit can be significantly reduced.

In addition, the inventor of this application proposed a semiconductor memory device having storing means for temporarily storing information time sequentially read out from the above-described cascade-connected type cell (U.S. application Ser. No. 07/721,255) (Japanese Patent Application No. H.3-41316).

In the above semiconductor memory device, data can be rewritten after the readout from a desired one of the capacitors of one cascade-connected type cell is effected and then the readout from another capacitor of the same cell is sequentially effected.

Further, the inventor of this application proposed a semiconductor memory device of a type for serially (sequentially) accessing a memory cell group in the same column of a cascade-connected type cell array while keeping the serial accessibility of the above-described cascade-connected type cell (U.S. application Ser. No. 07/850,318) (Japanese Patent Application No. H.3-74830).

The semiconductor memory device has a cascade-connected type cell array, utilizes a method for serially accessing a plurality of cells in the same column, and includes access means for time-serially reading out plural-bit information from a cell which stores storage information at the time of readout/rewrite for the cascade-connected type cell and sequentially rewriting the plural-bit information into a cell which is a different one of the cells in the same column and set in a non-use state. That is, the cells are serially accessed in the unit of column by using a method for using one extra cell for each column, reading data from a cell, and then storing (rewriting) the data into another cell which is accessed before reading out the data from the former cell and now set in a vacant state.

In the above serially accessible semiconductor memory cell, means for temporarily storing information time sequentially read out from the cells for rewriting at the time of readout/rewrite for the cell can be omitted and the high integration density can be attained. Therefore, the operation speed of an external memory device can be enhanced by replacing the above serially accessible semiconductor memory device by a memory device (such as a magnetic disk used as an external memory device of a computer system) for serially reading/writing data in the unit of block.

In the application field of the recent DRAMs, since the field of processing such as the block transfer with respect to the cache memory, processing or holding of image data which can be coped with by serial access is rapidly expanding, the application field of the above serially accessible semiconductor memory device is wide.

In order to further enhance the integration density and increase the capacity by suppressing the occupied area of the sense amplifier on the chip, one sense amplifier can be commonly used for a plurality of columns in a time sharing manner by selectively connecting the sense amplifier by use of a switching means. The technique for commonly using one sense amplifier for a plurality of columns in a time sharing manner in a DRAM cell array of a type for time-serially reading out plural-bit information is disclosed in "1991 IEEE ISSCC DIGEST OF TECHNICAL PAPERS pp. 107 'A Block-Oriented RAM with Half-Sized DRAM Cell and Quasi-Folded Data-Line Architecture' K. Kimura et al.

However, in a case where a shared sense amplifier system in which one sense amplifier is commonly used by four columns, for example, in a time sharing manner as described above is used as a DRAM having a cell array of a type for time-serially reading out plural-bit information, a readout signal from the cascade-connected type cell is simultaneously supplied to the four columns, and while data is being read out from one of the columns, the other three columns are set into a readout stand-by state.

If the potential of the bit line of one column for which the readout operation is now effected is changed to the full amplitude of the power source potential to effect the rewrite operation, the noise caused by the capacitive coupling between the bit lines occurs on the bit line (to which a readout signal from the memory cell is already supplied) of another column adjacent to the above column, and therefore, the amount of signal subsequently read out from the other column is significantly reduced so that the sense operation may be delayed and the sense operation may be sometimes erroneously effected to output erroneous data.

SUMMARY OF THE INVENTION

This invention has been made to solve a problem caused by the noise occurring on the bit line of a column adjacent to one column when the potential of the bit line of the one column for which the readout operation is effected is changed to the full amplitude of the power source potential to effect the rewrite operation in a DRAM having a shared sense amplifier system for serially accessing a plurality of memory cells in the same column in a cascade-connected type memory cell array, and an object of this invention is to provide a DRAM capable of suppressing the amount of noise occurring on the bit line of the above column and preventing the delay and error in the sense operation at the time of subsequent readout of a signal from the above column.

In order to attain the above object, a DRAM of this invention comprises a memory cell array having cascade-connected type memory cells arranged in a matrix form and each capable of storing plural-bit information in the unit of bit; sense amplifiers each arranged for a preset number of columns in the memory cell array and disposed in the central portion of the preset number of columns in the arrangement direction of the bit lines; switching circuits disposed on both sides of the sense amplifier, for electrically and selectively connecting the preset number of columns to the sense amplifier; an address designation circuit for serially designating addresses of a plurality of memory cells lying on both sides of the sense amplifier in the same column of the memory cell array; a word line driving circuit for selectively driving a memory cell of an address designated by the address designation circuit; a column selection circuit for selecting the column of the memory cell array; and an access control circuit for time-serially reading out plural-bit information from one of the memory cells storing storage information and lying on one side of the sense amplifier and sequentially rewriting the plural-bit information into one of the memory cells lying on the other side of the sense amplifier and set in a non-use state at the time of serial access to a plurality of memory cells in a desired column of the memory cell array.

According to the above DRAM, it becomes possible to omit means for temporarily storing information time-serially read out from the memory cell for the rewrite operation by disposing two additional memory cells (one memory cell on each side of the sense amplifier) for each column in addition to the memory cells for information storage. Further, since the shared sense amplifier system is used and one sense amplifier is commonly used for a plurality of columns in a time sharing manner, the pattern area can be reduced and the integration density can be increased.

Further, in a case where the access is made so as to sequentially rewrite information which is time-serially read out from a cell lying on one side of the sense amplifier in one column into a cell set in the non-use state and lying on the other side of the sense amplifier in the same column as the above cell, even if the potential of the bit line on the other side of the sense amplifier is changed to the full amplitude of the power source potential for the rewrite operation, the magnitude of the capacitive coupling between the above bit line and a bit line via which a signal is read out from a cell lying on one side of the sense amplifier of the other column can be made as small as negligible. Therefore, the amount of noise caused by the capacitive coupling between the bit lines and occurring on the bit line lying on one side of the sense amplifier of the other column can be suppressed so that the delay and error of the sense operation effected when a signal is subsequently read out from a cell on one side of the sense amplifier of the other column can be prevented.

Even if the potential of a bit line lying on the other side of the sense amplifier of a column is changed to the full amplitude of the power source potential for the rewrite operation, the amount of noise occurring on a bit line which lies on the other side of the sense amplifier of another column and which is not yet subjected to the readout operation can be suppressed by precharging the bit line to the power source potential.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a circuit diagram showing part of a DRAM according to a first embodiment of this invention;

FIG. 4 is a circuit diagram showing one example of part of a sense amplifier, switching circuit, bit line precharge circuit and dummy cell circuit shown in FIG.

FIG. 7 is an operation illustrating diagram for illustrating the outline of the serial access operation of the DRAM shown in FIG.

FIG. 8 is an operation illustrating diagram for illustrating the first serial access operation of FIG. 7 in detail;

FIG. 12 is a circuit diagram showing part of a serial access control circuit shown in FIG. 3;

FIG. 13 is a circuit diagram showing part of a modification of the DRAM shown in FIG. 3; and FIGS. 14A and 14B are circuit diagrams showing part of a modification of the DRAM shown in FIG. 3.

DETAILED DESCRIPTION OF THE PREFERRED EMBODIMENTS

Figure 1A:
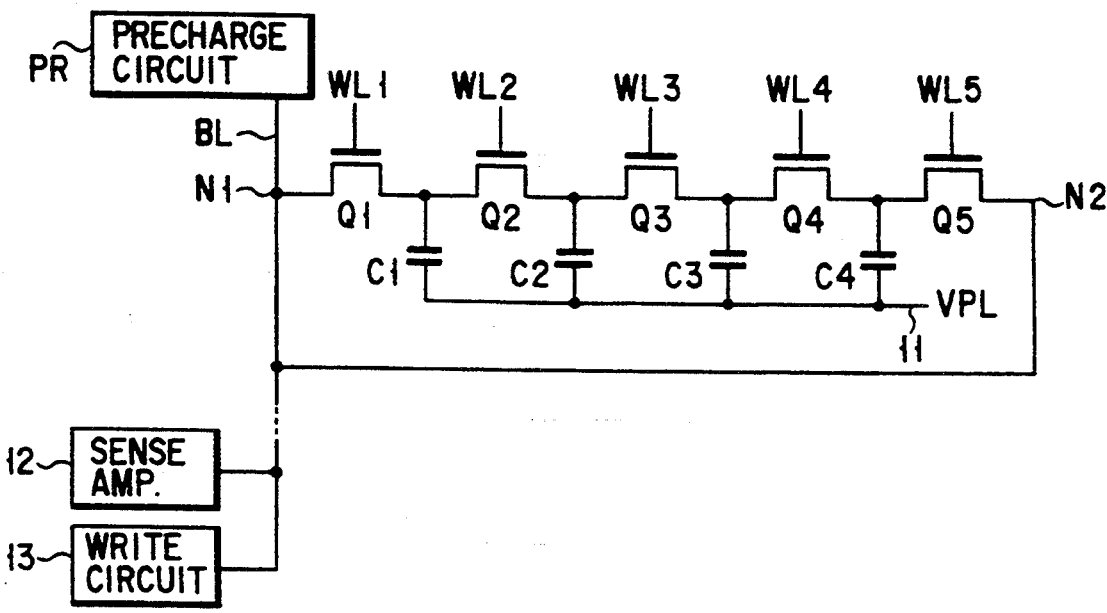
FIG. 1A is an equivalent circuit diagram showing one example of a semiconductor memory cell which is now proposed.

There will now be described embodiments of a DRAM according to this invention with reference to the accompanying drawings. In this explanation, the same reference numerals are attached to the same portions throughout the entire drawings and the repetitive explanation therefor is omitted.

FIG. 3 is a circuit diagram showing part of a DRAM using a cascade-connected cell array according to a first embodiment of this invention.

MCiL (i=0, 1, - - - , 32) and MCiR (i=0, 1, - - - , 32) denote cascade-connected memory cells which can store plural-bit (in this example, 4-bit) information in the unit of bit and which are arranged in a matrix form to constitute a memory cell array. In FIG. 3, only four columns CL1 to CL4 of the memory cell array are shown as examples.

SA denotes a bit line sense amplifier (which is hereinafter simply referred to as a sense amplifier) constructed by a latch type amplifier which is provided for every preset number of columns (in this example, for every four columns) in the memory cell array and arranged in the central portion of the four columns in the bit line arrangement direction.

BL denotes a bit line commonly connected to memory cells on the same column on one side (for example, left side) of the sense amplifier SA and /BL denotes a bit line commonly connected to memory cells on the same column on the other side (for example, right side) of the sense amplifier SA.

By the above connection, a memory cell array of open bit line configuration is constructed. In this example, (n (integer) +1) memory cells, in this example, 33 memory cells are arranged on each side of the sense amplifier SA in each column, and the 33 memory cells arranged on the left side of the sense amplifier SA in each of the columns CL1 to CL4 are denoted by MC0L to MC32L and the 33 memory cells arranged on the right side of the sense amplifier SA are denoted by MC0R to MC32R.

The memory cells of n (in this example, 32) among the 33 memory cells MC0L to MC32L on the left side of the sense amplifier SA are used for data storage and one memory cell is additionally provided. Likewise, 32 memory cells among the 33 memory cells MC0R to MC32R on the right side of the sense amplifier SA are used for data storage and one memory cell is additionally provided. By use of the 2n (in this example, 64) data storage memory cells for each column, storage of 256-bit block data can be attained by the access operation as will be described later.

SWL denotes a first switch circuit for switching the circuit connection so as to permit the sense amplifier SA to be commonly used for the four columns lying on the left side in a time sharing manner. SWR denotes a second switch circuit for switching the circuit connection so as to permit the sense amplifier SA to be commonly used for the four columns lying on the right side in a time sharing manner. Thus, each of the sense amplifiers can be commonly used by eight bit lines in a time sharing manner.

DL denotes a common bit line (digit line) between one of the paired input/output nodes of the sense amplifier SA and the first switch circuit SWL and /DL denotes a common bit line (digit line) between the other of the paired input/output nodes of the sense amplifier SA and the second switch circuit SWR.

PR denotes a bit line precharge circuit connected to the paired digit lines DL, /DL, for example, for precharging/equalizing the paired digit lines DL, /DL and the paired bit lines BL, /BL to a preset potential (in this example, power source potential Vcc) at a preset timing and is set into the ON state by a bit line precharge signal /EQL.

DCL denotes a first dummy cell circuit for creating a sense reference potential of the sense amplifier SA at the time of readout from a memory cell on one side of the sense amplifier SA, and DCR denotes a second dummy cell circuit for creating a sense reference potential of the sense amplifier SA at the time of readout from a memory cell on the other side of the sense amplifier SA. DWLL denotes a first dummy word line and DWLR denotes a second dummy word line DWL.

DQ, /DQ denote paired data lines commonly provided for a plurality of columns.

CSW denotes a column switch circuit connected between the paired digit lines DL, /DL and the paired data lines DQ, /DQ and controlled by a column decoder output line CSL.

ADL is a first address designation circuit for serially designating row addresses of a plurality of cells in the same column on the left side of the sense amplifier SA. ADR is a second address designation circuit for serially designating row addresses of a plurality of cells in the same column on the right side of the sense amplifier SA.

WDL denotes a first word line driving circuit for selectively driving a memory cell of an address designated by the first address designation circuit ADL. WDR denotes a second word line driving circuit for selectively driving a memory cell of an address designated by the second address designation circuit ADR.

A serial access control circuit 10 has a function of effecting the control operation to time-serially read out plural-bit information from one of the memory cells storing storage information and lying on one side of the sense amplifier SA and sequentially rewrite the plural-bit information into one of the memory cells lying on the other side of the sense amplifier and set in a non-use state at the time of serial access to a plurality of memory cells in a desired column of the memory cell array.

Further, the serial access control circuit 10 has a function of effecting the control operation to sequentially select the plurality of columns and commonly use the sense amplifier SA for the plurality of columns in a time sharing manner at the time of serial access to a plurality of memory cells in the plurality of columns.

FIG. 4 shows an example of the sense amplifier SA, first switching circuit SWL, second switching circuit SWR, bit line precharge circuit PR, first dummy cell circuit DCL and second dummy cell circuit DCR.

The sense amplifier SA includes an NMOS sense amplifier NSA for sense operation and a PMOS sense amplifier PSA for restore operation. The activated/deactivated state of the sensing NMOS sense amplifier NSA is controlled by a sense amplifier control signal line /SAN and an NMOS transistor QN for controlling the activation of the sense amplifier is connected between the sense amplifier control signal line /SAN and the ground potential Vss.

The first switch circuit SWL is constructed by first transfer gates TG1L to TG4L which are controlled by control signals $\phi 1L$, $\phi 2L$, $\phi 3L$ and $\phi 4L$ so as to selectively connect the four bit lines BL lying on the left side of the sense amplifier SA to the sense amplifier SA. The second switch circuit SWR is constructed by second transfer gates TG1R to TG4R which are controlled by control signals $\phi 1R$, $\phi 2R$, $\phi 3R$ and $\phi 4R$ so as to selectively connect the four bit lines /BL lying on the right side of the sense amplifier SA to the sense amplifier SA.

The first dummy cell circuit DCL is constructed by a coupling capacitor C for dummy cell connected between the digit line DL and the first dummy word line DWLL. The second dummy cell circuit DCR is constructed by a coupling capacitor C for duchy cell connected between the digit line/DL and the second dummy word line DWLR.

Figure 5:
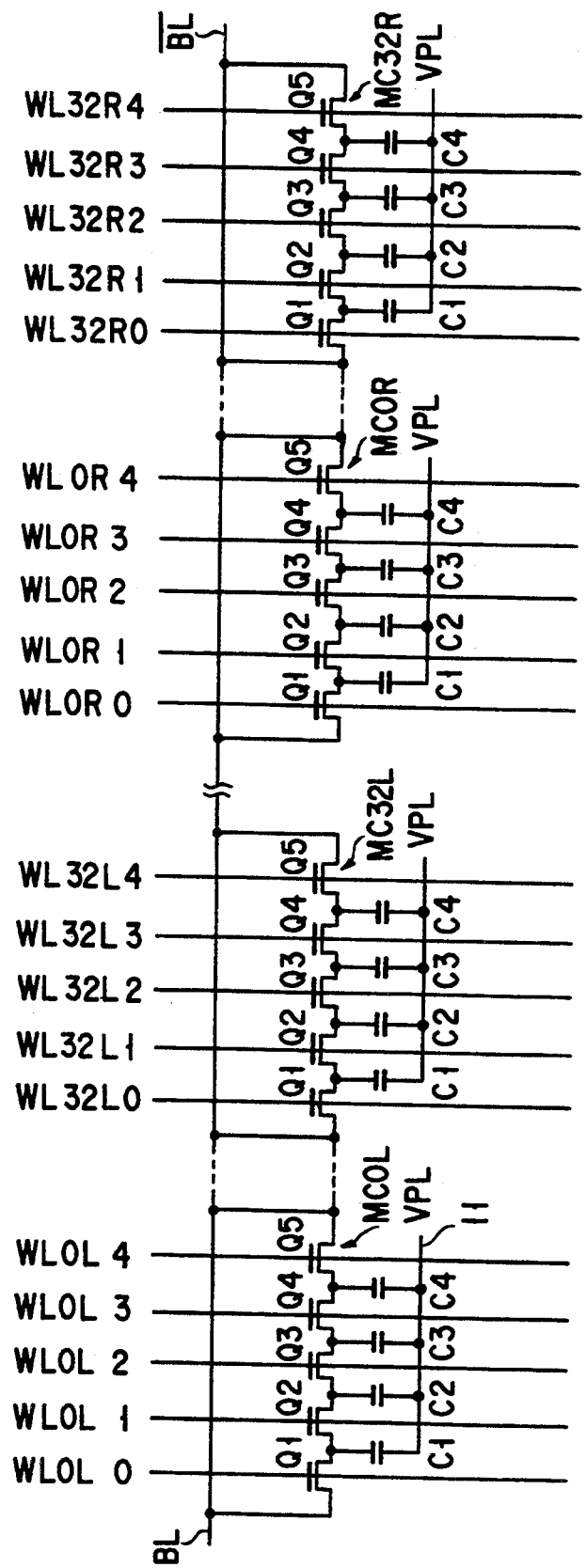
FIG. 5 is a circuit diagram showing one example of a cascade-connected type DRAM cell of one column in a memory cell array shown in FIG. 3.

FIG. 5 is a circuit diagram showing one example of a cascade-connected type DRAM cell of one column in the memory cell array shown in FIG. 3.

For example, in the same manner as shown in FIG. 1A, the cells MCiL (i=0, 1, - - -, 32) and MCiR (i=0, 1, - - -, 32) each include three or more (in this example, five) MOS transistors Q1 to Q5 cascade-connected between a first node N1 and a second node N2, and a plurality of capacitors C1 to C4 for information storage which are connected at one end to the respective connection nodes between the cascade-connected transistors.

The first node N1 and the second node (N2) are connected together. The node N1 and node N2 of the cell MCiL are connected to the bit line BL and the node N1 and node N2 of the cell MCiR are connected to the bit line /BL.

The other ends of the capacitors C1 to C4 are commonly connected to the capacitor wiring 11. In this example, the plate electrodes of the capacitors C1 to C4 are commonly connected and the plate electrodes are commonly applied with a preset capacitor plate potential VPL like the other memory cells.

The word lines (WL0L0 to WL0L4) to (WL32L0 to WL32L4), (WL0R0 to WL0R4) to (WL32R0 to WL32R4) are respectively connected to the gates of the transistors Q1 to Q5 of the cell on the same row in the memory cell array.

Figure 6:
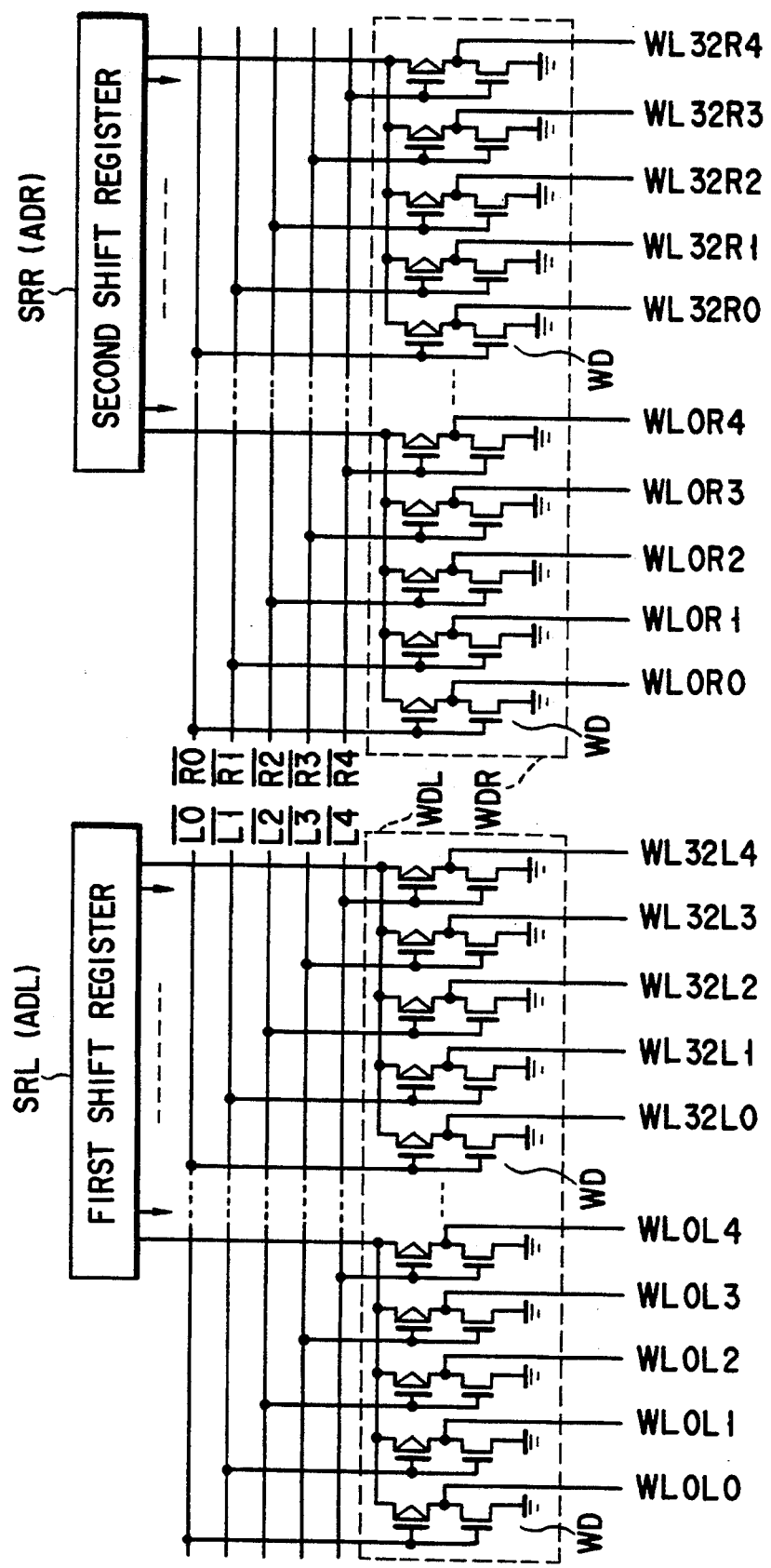
FIG. 6 is a circuit diagram showing one example of an address designation circuit and a word line driving circuit shown in FIG. 3.

FIG. 6 is a circuit diagram showing one example of part of the first address designation circuit ADL, second address designation circuit ADL, first word line driving circuit WDL, and second word line driving circuit WDR shown in FIG. 3.

As the first address designation circuit ADL, a first shift register SRL having stages of a number (in this example, 33 stages) corresponding to 1/k (k is an integer) (in this example, 1/5) of the number of rows on one side of the sense amplifier SA of the memory cell array is used. That is, the first shift register SR has 33 stages corresponding to 33 groups of word lines (WL0L0 to WL0L4)to (WL32L0 to WL32L4) each group of which is constructed by five word lines on the left side of the sense amplifier SA in the memory cell array.

As the first word line driving circuit WDL, word line driving circuits WD of a number corresponding to the number of rows on the left side of the sense amplifier SA of the memory cell array (that is, 33 groups of word line driving circuits each group of which is constructed by five word line driving circuits) are used. In this case, in order to control and select the five word line driving circuits WD of each group by an output of a corresponding stage of the first shift register SRL, the outputs of the respective stages of the first shift register SRL are supplied as the power source voltages (or operation control signals) of the word line driving circuits WD of the respective groups.

Each of the word line driving circuits WD is constructed by a CMOS inverter, for example. The five word line driving circuits WD of each group in the first word line driving circuit WDL respectively drive the five word lines (WLiL0 to WLiL4) of a corresponding group among the word lines (WL0L0 to WL0L4) to (WL32L0 to WL32L4). Further, in order to sequentially supply driving inputs to the five wordline driving circuits WD of each group, five wirings /L0 to /L4 are provided.

By using the above first word line driving circuit WDL, it becomes possible to effect the control operation so as to sequentially set the five word lines (WLiL0 to WLiL4) of each group lying on the left side of the sense amplifier SA into the ON state and keep them in the ON state for a preset period of time at the time of serial access of one cycle as will, be described later.

In the same manner as described above, as the second address designation circuit ADR, a second shift register SRR having 33 stages corresponding to 33 groups of word lines (WL0R0 to WL0R4) to (WL32R0 to WL32R4) each group of which is constructed by five word lines on the right side of the sense amplifier SA is used. Further, as the second word line driving circuit WDR, word line driving circuits WD of a number corresponding to the number of rows on the right side of the sense amplifier SA of the memory cell array are used.

Then, in order to control and select the word line driving circuits WD of each group by an output of a corresponding stage of the second shift register SRR, the outputs of the respective stages of the second shift register SRR are supplied as the power source voltages of the five word line driving circuits WD of the respective groups.

The five word line driving circuits WD of each group in the second word line driving circuit WDR respectively drive the five word lines (WLiR0 to WLiR4) of a corresponding group among the word lines (WL0R0 to WL0R4) to (WL32R0 to WL32R4). Further, in order to sequentially supply driving inputs to the five word line driving circuits WD of each group, five wirings /R0 to R4 are provided.

By using the above second word line driving circuit WDR, it becomes possible to effect the control operation so as to sequentially set the five word lines (WLiR0 to WLiR4) of each group lying on the right side of the sense amplifier SA into the ON state and keep them in the ON state for a preset period of time at the time of serial access of one cycle as will be described later.

Next, the outline of the serial access operation of the DRAM shown in FIG. 3 is explained with reference to FIGS. 7 and 8.

FIG. 7 is an operation illustrating diagram for illustrating the outline of the first to sixty-sixth serial access operations in the DRAM of FIG. 3 and FIG. 8 is an operation illustrating diagram for illustrating the first serial access operation in FIG. 7.

In FIG. 8, "1" of a code (1, m, Ci) for identifying bit data of the cell indicates a column number (in this example, one of 1 to 4), m indicates the number (in this example, one of 0L to 32L, OR to 32R) of a row to which the cell belongs, and Ci indicates a bit number (capacitor number, in this example, one of C1 to C4).

In FIGS. 7 and 8, assume that, in the initial condition, a series of data items (block data items) are stored into the cells MC0L, MC0R, MC1L, MC1R, - - -, MC31L, MC31R, the cells MC32L and MC32R are set in the non-use state (non-storage state) and the block data items are sequentially read out by the serial access and at the same time they are rewritten.

At the time of first serial access, the operation of sequentially setting the word lines WL0L0 to WL0L3 into the ON state to read out storage information of the capacitors C1 to C4 of the cell MC0L to the bit line BL and sequentially setting the word lines WL32R1 to WL32R4 into the OFF state to sequentially rewrite the above 4-bit information into the capacitors C1 to C4 of one (corresponding to MC32R at this time) of the cells which is set in the non-use state and lies on the opposite side of the sense amplifier SA of the same column is started at the time t0. At the time of this operation, storage information items of the cells MC0L on the four columns on the same row are simultaneously read out to the corresponding bit lines BL, for each bit of the above 4-bit information, sensed and amplified by the sense amplifier SA in a time sharing manner, and simultaneously rewritten into a corresponding one of the cells MC32R which is set in the non-use state and lies on the opposite side of the sense amplifier SA on the same column. Thus, the readout/storage of 16-bit information is effected.

In the same manner as the above-described operation, the operation or sequentially reading out 4-bit information of the cell MC0R to the bit line/BL and sequentially rewriting the same into one cell (corresponding to MC0L at this time) which is set in the non-use state and lies on the opposite side of the sense amplifier SA of the same column is started at the time t1.

Further, the operation of sequentially reading out 4-bit information of the cell MC1L to the bit line BL and sequentially rewriting the same into one cell (corresponding to MC0R at this time) which is set in the non-use state and lies on the opposite side of the sense amplifier SA of the same column is started at the time t2.

In this manner, the read/rewrite operations are sequentially effected for each unit of two cells lying in the same column and set in a different combination of readout and write-in states while sequentially selecting four columns, and finally, at the time t64, a state in which 4-bit information of the cell MC31R is rewritten into the cell MC31L is set. As a result, the readout/storage operations for 1024 bits (=16 bits×64 cycles) have been effected.

Then, in the succeeding dummy cycle period, the word lines WL32L1 to WL32L4 are set into the ON state and the cell MC32G which is to be initially subjected to the write-in process at the time of serial access of the next cycle (second cycle) is set into the stand-by state.

As described above, by effecting the first serial access to the 2(n+1), that is, 66 cells in the same column, successive block data items (256 bits) stored in the 2n, that is, 64 cells are sequentially read out, and at the same time, the block data items are rewritten into the 64 memory cells MC32R, MC0L, MC0R, MC1L, MC1R, - - -, MC31L including one cell which is set in the non-use state before the readout operation.

At the time of second serial access, the head address (word line address) of the first serial access is changed to the opposite side of the sense amplifier SA and returned by one address number, and the operation of rewriting readout data of the cell MC32R into the cell MC32L is started, and finally, readout data of the cell MC31L is rewritten into the cell MC30R. Then, in the succeeding dummy cycle period, the cell MC31R which is to be first subjected to the writing process at the time of the next (third) serial access is set into the stand-by state.

By the second serial access, the block data items are stored into the cells MC32L, MC32R, MC0L, MC0R, - - -, MC30R.

After this, in the same manner as the above-described serial access, the head address of the preceding serial access is changed to the opposite side of the sense amplifier SA and returned by one address number, and then the serial access is repeatedly effected. Therefore, at the time of sixty-sixth serial access, the operation of rewriting readout data of the cell MC0R into the cell MC0L is started, and finally, readout data of the cell MC32L is rewritten into the cell MC31R. Then, in the succeeding dummy cycle period, the cell MC32R which is to be first subjected to the writing process at the time of the next serial access is set into the stand-by state. This sets up a state (initial state) in which the block data items are stored in the cells MC0L, MC0R, MC1L, MCiR, - - -, MC31L, MC31R.

In order to alternately change the head address of the serial access to the left side and right side of the sense amplifier, it is necessary to take a preparation procedure for non-activating the word line connected the cell from which data is finally read out in the preceding one of the two successive serial accesses and activating the word line connected the cell which is set in the non-use state and lies on the opposite side of the sense amplifier SA.

It is possible to design the serial access control circuit 10 so as to have a function of alternately changing the head address to the left side and right side of the sense amplifier for each serial access and returning the head address of the word line to which access is made in the next cycle by one address number.

In order to design the serial access control circuit 10 which can attain the above function, there may be provided such a circuit as shown in FIG. 12, for example. In FIG. 12, 21 denotes an odd-even flag circuit whose output level is inverted for each serial access and which indicates that the serial access is an odd-numbered serial access or even-numbered serial access. 22 denotes a head address down-counter in which a serial access start address is initially set and whose content is reduced by "1" for each serial access. 23 denotes a first head address decoder for designating the head address for the first shift register SRL lying on the left side of the sense amplifier SA and 24 denotes a second head address decoder for designating the head address for the second shift register SRR lying on the right side of the sense amplifier SA. 25 denotes a switch circuit for selectively supplying an output of the head address down-counter 22 to the first head address decoder 23 or second head address decoder 24 according to an output level of the odd-even flag circuit 21.

Figure 2A:
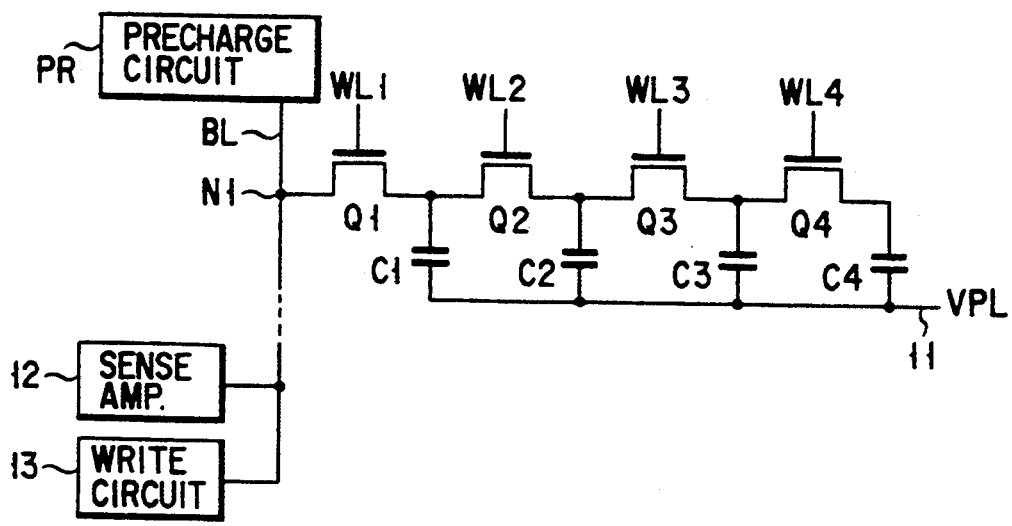
FIG. 2A is an equivalent circuit diagram showing another example of a semiconductor memory cell which is now proposed.
Figure 2B:
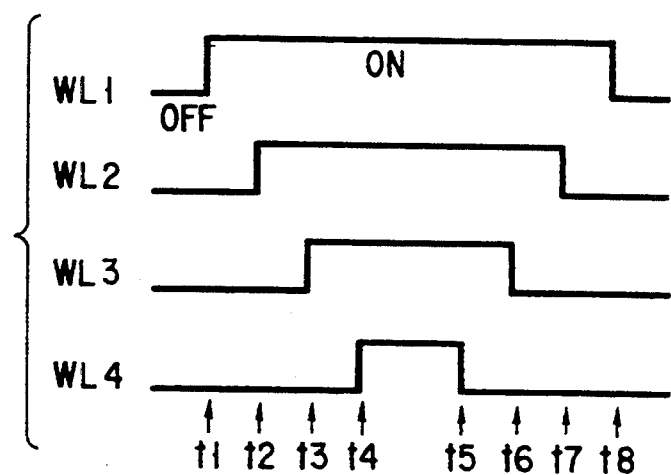
FIG. 2B is a timing waveform diagram showing one example of the readout operation and write operation of the memory cell of FIG. 2A.

Further, in the DRAM of FIG. 3, for example, in a case where the cascade-connected DRAM cell array shown in FIG. 2A is used and the driving method shown in FIG. 2B is used, the plural-bit data order of the readout data and the plural-bit data order of the stored data are reversed with respect to each other when the readout/storage operation of bit data is alternately effected for cells lying on the left and right sides of the sense amplifier SA as described before. In this case, for example, the plural-bit data order of the readout output of the DRAM may be corrected by using a circuit shown in FIG.

In FIG. 13, 31 denotes an odd-even flag circuit whose output level is inverted for each serial access and which indicates that the serial access is an odd-numbered serial access or even-numbered serial access (which indicates that bit data read out from the memory cell is set in an original data order or inverted data order).

32 denotes a data order correction circuit connected between the paired data lines DQ, /DQ shown in FIG. 3 and an output buffer (not shown). The data order correction circuit 32 includes a serial/parallel converter circuit 33 for converting 4-bit data serially read out into parallel data and four-bit selector circuits 341 to 344 to which 4-bit data from the serial/parallel converter circuit 33 is input. The selector circuits 341 to 344 are controlled according to the output level of the odd-even flag circuit 31 so as to determine whether the bit data is transferred with the data order kept unchanged or with the data order inverted.

Next, the serial access operation for one column which is the basic serial operation described above and the operation for sequentially switching the four columns are explained in detail with reference to FIGS. 9 to 11 by taking the operation effected at the first serial access described before as an example.

Figure 9:
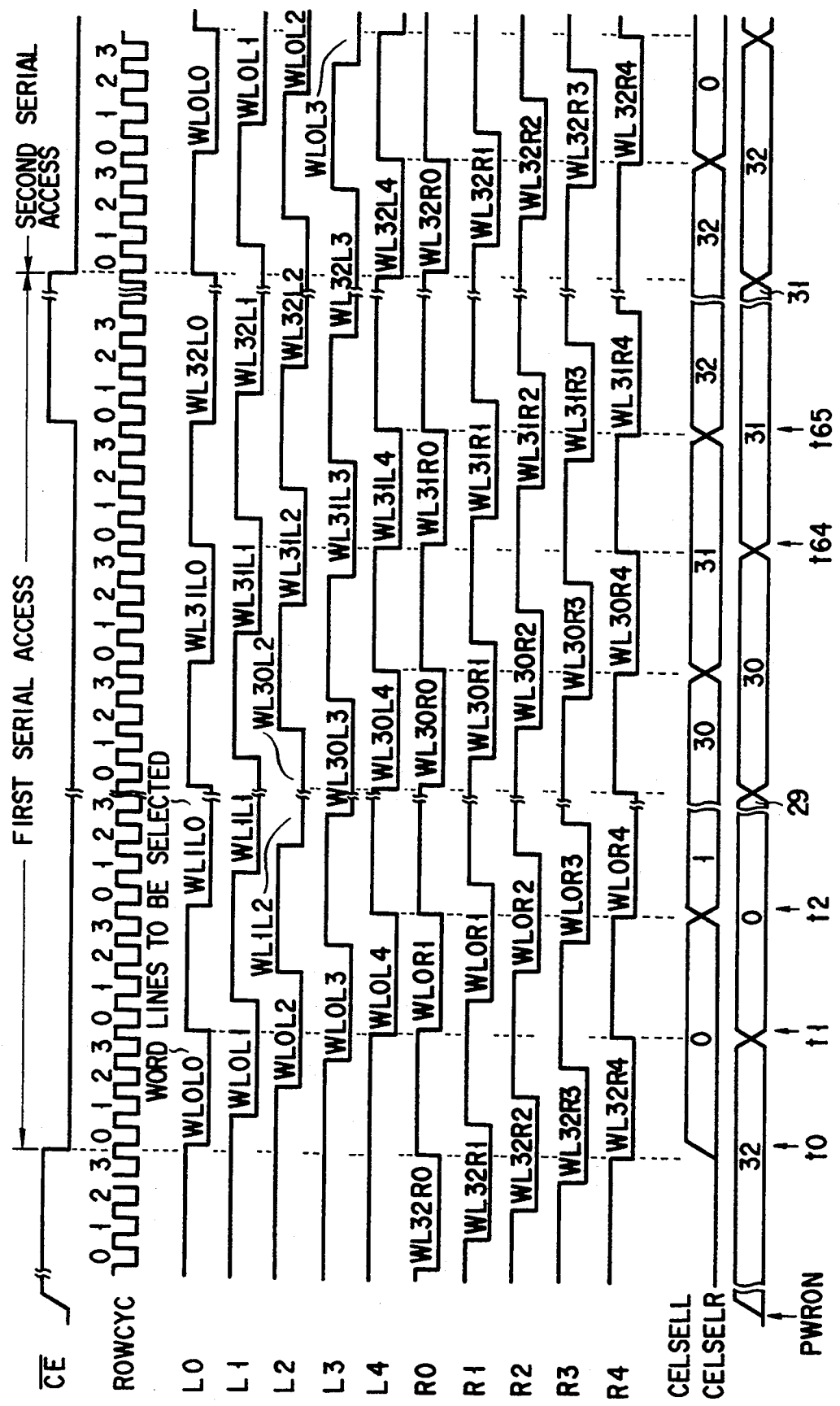
FIG. 9 is a timing waveform diagram showing one example of the timing of the first serial access operation of FIG. 7.

FIG. 9 is a timing waveform diagram showing one example of the timing of the first serial access operation of FIG. 7.

Figure 10:
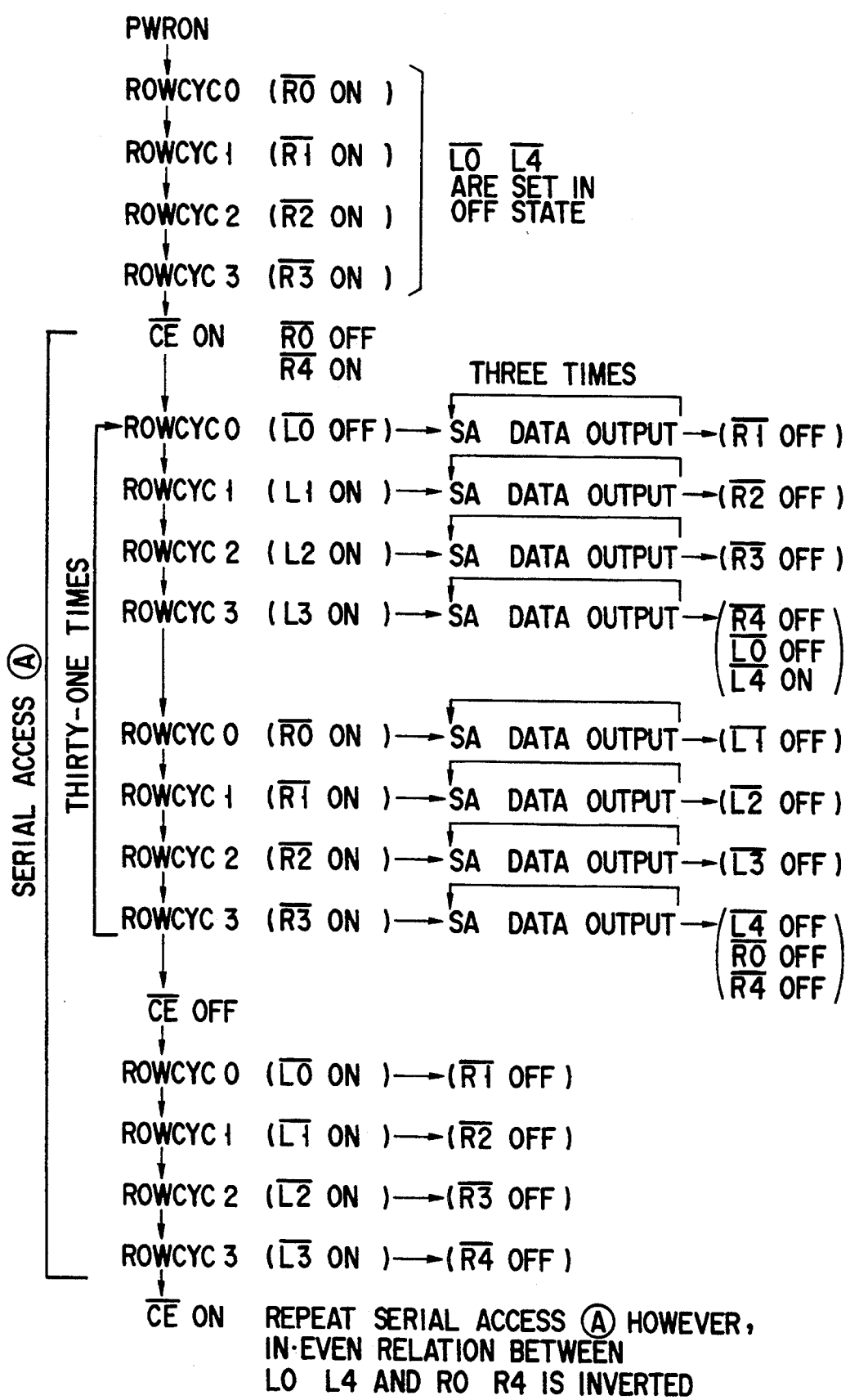
FIG. 10 is a diagram showing an operation sequence corresponding to the timing waveform diagram of FIG. 9.

FIG. 10 is a diagram showing an operation sequence corresponding to the timing waveform diagram of FIG. 9.

Figure 11:
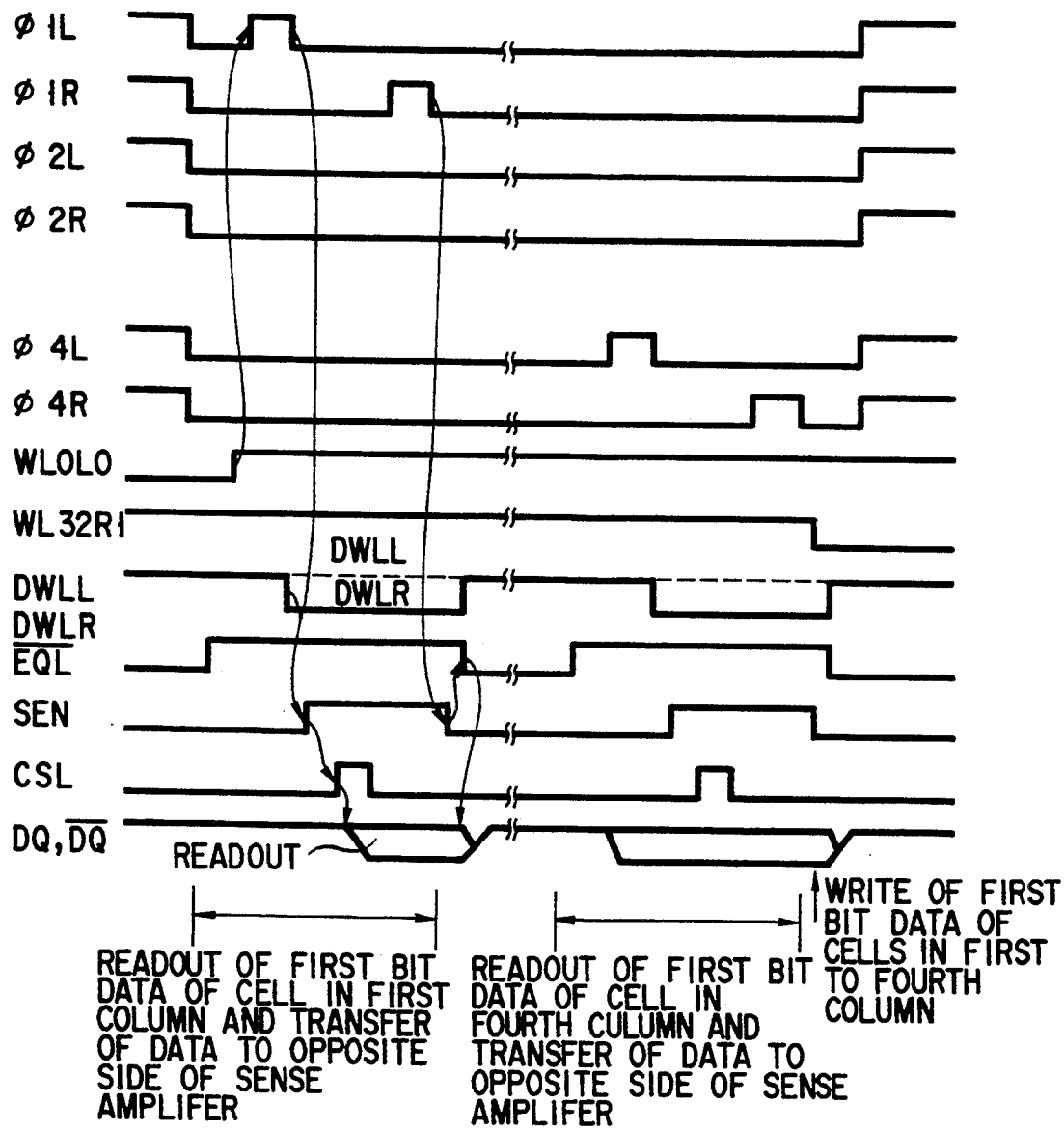
FIG. 11 is a timing waveform diagram showing the sequential selection operation of four columns in the first serial access operation of FIG. 7.

FIG. 11 is a timing waveform diagram showing an example of the operation for sequentially selecting four columns in the operation period in which data is read out from the capacitor C1 of the cell MC0L and stored into the capacitor C1 of the cell MC32R in the first serial access operation of FIG. 7.

In FIG. 9, PWRON indicates the timing at which the operation power source of the DRAM is turned on and the initialization of the DRAM circuit is effected by the turn-ON of the power source.

A chip enable signal /CE defines the readout/rewrite operation period of the serial access in a period in which it is set in the active state ("L" level), defines the dummy cycle period of the serial access in a period in which it is set in the non-active state ("H" level), and is initialized at the time of turn-ON of the power source and set into the non-active state.

0 to 32 in a cell selection signal CELSELL indicate outputs of the respective stages of the first shift register SRL and five word Line driving circuits WD of a corresponding group are set into the operative state by the output of each stage. The first shift register SRL changes the output state from the final stage from which the "H" level is generated to the first stage in synchronism with the activation timing of the chip enable signal /CE each time the serial access operation is effected and sequentially generates outputs of "H" level from the first stage to the final stage. However, at the time of first serial access after the turn-ON of the power source, the shift register is controlled to sequentially generate outputs of "H" level from the first stage to the final stage starting from the state in which the "H" level is generated from the first stage.

0 to 32 in a cell selection signal CELSELR indicate outputs of the respective stages of the second shift register SRR and five word line driving circuits WD of a corresponding group are set into the operative state by the output of each stage. The output of each stage of the second shift register SRR is controlled to be generated with a delay of half cycle with respect to the output of each stage of the First shift register SRL. However, immediately after the turn-ON of the power source, it is initialized to the state in which the "H" level is generated from the final stage.

0 to 3 in a signal ROWCYC indicate periods set for sequentially make accesses for the operation of reading/rewriting each bit of 4-bit data of the cell. The operation cycle for sequentially activating the periods 0 to 3 of the signal ROWCYC is started by the turn-ON of the power source and is repeatedly effected.

Signals /L0 to L4 are signals for wirings used for sequentially supplying driving inputs to the five word line driving circuits WD of each group of the first word line driving circuit WDL. The signals /L0 to /L4 are held in the non-active state for a preset period (a period in which activation for 0 to 3 of the signal ROWCYC is effected once) after the turn-ON of the power source, and after this, the cycle in which they are sequentially activated is started and the cycle is repeated. In this case, the OFF timing of the signal /L0 and the ON timing of the signal /L4 are set at the same timing, that is, the drive completion timing of one of the five word line driving circuits of each group of the first word line driving circuit WDL which is first driven is set at the same timing as the drive starting timing of one of the word line driving circuits which is finally driven. This makes it possible to reduce the cycle time of the signals /L0 to /L4.

Signals /R0 to/R4 are signals for wirings used for sequentially supplying driving inputs to the five word line driving circuits WD of each group of the second word line driving circuit WDR. A cycle of sequentially activating the signals /R0 to/R4 is started by the turn-ON of the power source and the cycle is repeated. In this case, the OFF timing of the signal /R0 and the ON timing of the signal /R4 are set at the same timing, that is, the drive completion timing of one of the five word line driving circuits of each group of the second word line driving circuit WDR which is first driven is set at the same timing as the drive starting timing of one of the word line driving circuits which is finally driven. This makes it possible to reduce the cycle time of the signals /R0 to/R4.

The ON timing of the signal /L0 (that is, the drive starting timing of one of the five word line driving circuits of each group of the first word line driving circuit WDL which is first driven) and the ON timing of the signal /R0 (that is, the drive starting timing of one of the five word line driving circuits of each group of the second word line driving circuit WDR which is first driven) are deviated from each other by a half cycle of the output of each stage of the first shift register SRL.

Further, the ON timing of the signal /L0 is set with a small delay with respect to the OFF timing of the signal /R0, that is, the drive starting timing of one of the five word line driving circuits of each group of the first word line driving circuit WDL which is first driven is delayed with respect to the drive completion timing of one of the five word line driving circuits of each group of the second word line driving circuit WDR which is first driven. Likewise, the ON timing of the signal /R0 is set with a small delay with respect to the OFF timing of the signal /L0, that is, the drive starting timing of one of the five word line driving circuits of each group of the second word line driving circuit WDR which is first driven is delayed with respect to the drive completion timing of one of the five word line driving circuits of each group of the first word line driving circuit WDL which is first driven.

At the time t0 (at which the transistor Q1 of the cell MC32R is set in the OFF state, the transistors Q2 to Q5 of the cell MC32R are set in the ON state and the transistors Q1 to Q5 of the other cells are set in the OFF state), the first switching circuit SWL and the second switching circuit SWR are set in the ON state and the paired digit lines DL, /DL and the paired bit lines BL, /BL are precharged to the power source potential Vcc for a preset period of time by the bit line precharge circuit PR. After this, if the transistor Q1 of the cell MC0L is turned on, storage information of the capacitor C1 of the cell MC0L is read out to the bit lines BL, - - - via the transistor Q1. Then, the first transfer gate TG1L connected to the bit line BL of the first column CL1 is set in the ON state for a preset period of time and data read out to the bit line BL is transmitted to the digit line DL. After this, the second dummy word line DWLR connected to the digit line /DL via the dummy capacitor C is set to the ground potential Vss for a preset period of time. As a result, a potential difference corresponding to readout data from the first column C1 occurs between the paired digit lines DL, /DL. Then, when the sense amplifier SA is operated at the timing $t_s$ for a preset period of time, the potentials of the digital lines DL, /DL are set to the rewrite potential by the sense output. After this, if the column switch circuit CSW is set in the ON state for a preset period of time, the potentials (readout information from the capacitor C1 of the cell MC0L of the first column CL1) of the digit line DL, /DL are output to the paired data lines DQ, /DQ. Then, the second transfer gate TG1R connected to the bit line/BL of the first column CL1 is set in the ON state for a preset period of time, and in this period, the rewrite potential of the digit line/DL is transmitted to the bit line /BL of the first column CL1.

Next, the paired digit lines DL, /DL are precharged to the power source potential Vcc again for a preset period of time by the bit line precharge circuit PR. After this, the first transfer gate TG2L connected to the bit line BL of the second column CL2 is set in the ON state for a preset period of time and data read out on the bit line BE is transmitted to the digit line DL. Then, the second dummy word line DWLR is set at the ground potential vss for a preset period of time. As a result, a potential difference corresponding to readout data from the cell of the second column CL2 occurs between the paired digit lines DL and /DL. Then, when the sense amplifier SA is operated at the timing $t_s$ for a preset period of time, the rewrite potential is set to the digit line DL, /DL by the sense output. After this, if the column switch circuit CSW is set in the ON state for a preset period of time, the potentials of the paired digit lines DL, /DL (readout information from the capacitor C1 of the cell MC0L of the second column CL2) are output to the paired data lines DQ, /DQ. Then, the second transfer gate TG2R connected to the bit line/BL of the second column CL2 is set in the ON state for a preset period of time, and in this period, the rewrite potential of the digit line/DL is transmitted to the bit line /BL of the second column CL2.

After this, in a manner similar to the above-described operation, a signal read out from the capacitor C1 of the cell MC0L of the third column CL3 to the bit line BL is sensed, then transmitted to the bit line BL of the third column CL3, and a signal read out from the capacitor C1 of the cell MC0L of the fourth column CL4 to the bit line BL is sensed, and then transmitted to the bit line /BL of the fourth column CL4.

After this, if the transistors Q2 of the cells MC32R of the first to fourth columns CL1 to CL4 are set into the OFF state, data items of the bit lines /BL of the first to fourth columns CL1 to CL4 are stored in the capacitors C1 of the cells MC32R.

In the above operation, in order to effect the column selection, it is necessary to use signals whose "H" level potential is set to be higher than the power source potential Vcc at least by the threshold voltage of the transfer gate as the control signals $\phi 1L$ to $\phi 4L$ applied to the gates of the first transfer gates TG1L to TG4R and the control signals $\phi 1R$ to $\phi 4R$ applied to the gates of the second transfer gates TG1R to TG4R.

Further, it is preferable to use a signal whose "H" level potential is set to be higher than the power source potential Vcc at least by the threshold voltage of the transfer gate for the column switch SWL as the signal CSL for controlling the column switch SWL. As the signal CSL, a signal whose "H" level potential is set equal to the power source potential Vcc may be used, but in this case, it is necessary to increase the size of the restoring P-channel sense amplifier PSA in order to write potentials of the paired input nodes of the sense amplifier SA to the full amplitude of the power source potential Vcc when data is written from the paired data lines DQ, /DQ to the paired digit lines DL, /DL.

Next, when the transistor Q2 of the cell MC32R is set in the OFF state, the transistors Q3 to Q5 of the cell MC32R are see in the ON state, the transistor Q1 of the cell MC0L is set in the ON state, and the transistors Q1 to Q5 of the other cells are set in the OFF state, the first switch circuit SWL and the second switch circuit SWR are set into the ON state and the paired digit lines DL, /DL and the paired bit lines BL, /BL are precharged to the power source potential vcc for a preset period of time by the bit line precharge circuit PR. After this, in a similar manner to the operation of reading out data from the capacitor C1 of the cell MC0L and storing the data into the capacitor C1 of the cell MC32R, data is read out from the capacitor C2 of the cell MC0L and stored into the capacitor C2 of the cell MC32R. In this case, it is necessary to effect the operation of setting the transistor Q2 of the cell MC0L into the ON state and setting the transistor Q3 of the cell MC32R into the OFF state.

After this, in the same manner as the above-described operation, the operation of reading out data from the capacitor C3 of the cell MC0L and storing the same into the capacitor C3 of the cell MC32R is effected by effecting the operation of setting the transistor Q3 of the cell MC0L into the ON state and setting the transistor Q4 of the cell MC32R into the OFF state, and the operation of reading out data from the capacitor C4 of the cell MC0L and storing the same into the capacitor C4 of the cell MC32R is effected by effecting the operation of setting the transistor Q4 of the cell MC0L into the ON state and setting the transistor Q5 of the cell MC32R into the OFF state.

The transistors Q5 and 01 of the cell MC0L are respectively set into the ON and OFF states (this operation may be effected by the time t1 at which the operation of reading out storage information of the other cell MC0R and rewriting the same into the cell MC0L is started after this) at the same time as that the transistor Q5 of the cell MC32R is set into the OFF state. As a result, the transistor Q1 of the cell MC0L is set into the OFF state, the transistors Q2 to Q5 thereof are set into the ON state, and the transistors Q1 to Q5 of the other cells are set into the OFF state so as to set up the standby state for the operation of reading out data from the cell MC0R and rewriting data into the cell MC0L which will be effected after this.

For the write operation for the above DRAM, necessary data may be set on the paired bit lines BL, /BL at the rewrite timing as described before. The columns CL1 to CL4 are selectively connected to an input/output circuit (not shown) via the paired data lines DQ, /DQ so as to write input data. The data lines DQ, /DQ may be divided for input and output.

Further, the refresh operation of the memory cell can be effected by making the serial access described before in the state in which the column selection switch CSW is set in the OFF state. In this case, the refresh operation may be effected in a preset cycle in response to a refresh signal from the exterior or a timer output of a refresh timer circuit provided in the circuit.

As described above, according to the DRAM of FIG. 3, by setting the transistors Q1 to Q5 of a cell which is to be subjected to the readout process, storage information items of the capacitors C1 to C4 of the cell are sequentially read out to the bit line BL or /BL and can be sequentially read out to the exterior of the DRAM chip when the sense amplifier SA is operated. That is, four digital information items (of four bits) can be read out in a preset order. Since the readout operation is sequentially effected for 64 cells used for storage of information for each column, it becomes possible to read out 4 bits×64×4 columns=1024 bits (128 bytes).

Further, by providing two additional memory cells (one memory cell on each side of the sense amplifier SA) for each column in addition to the memory cells for information storage, it becomes possible to omit means for temporarily storing information time-serially read out from the cell for rewriting. In addition, since the shared sense amplifier system is used and one bit line sense amplifier is commonly used for a plurality of columns in a time sharing manner, the pattern area can be reduced and the integration density can be made high, thereby making it possible to attain an extremely small chip size.

When access is made to sequentially rewrite information time-serially read out from a cell lying on one side of the sense amplifier on a column into a cell lying on the other side of the sense amplifier in the same column as the above cell and set in the non-use state and even if the potential of the bit line on the other side of the sense amplifier is changed to the full amplitude of the power source potential for rewriting, the capacitive coupling between the bit line and another bit line to which a signal is read out from a cell on the one side of the sense amplifier on another column is as small as negligible. Therefore, the amount of noise caused by the capacitive coupling between the bit lines and occurring on the bit line on one side of the sense amplifier of the above column can be suppressed so that the delay or error in the sense amplifier operation caused when a signal is subsequently read out from a cell on one side of the sense amplifier of the other column can be prevented.

Even if the potential of the bit line lying on the other side of the sense amplifier is changed to the full amplitude of the power source potential for rewriting, the amount of noise occurring on a bit line which lies on the other side of the sense amplifier of another column and which is not yet subjected to the readout process can be suppressed by precharging the bit line to the power source potential.

Further, in the DRAM, since each bit information time-serially read out from the cell is rewritten immediately after the readout operation, the operation of the sense amplifier necessary for the readout/rewrite for each bit is only once, thereby making it possible to attain the low power consumption.

By controlling the transfer gate which is one of the transfer gates connected between the bit lines BL, /BL and the sense amplifier SA and which is set into the ON state when a signal read out from the memory cell is transferred to the sense amplifier SA side into the OFF state immediately after the data transfer, that is, by effecting the control operation to prevent the charge and discharge operation for the bit line BL by the sense amplifier SA at the time of readout of information from the memory cell and charge and discharge the bit line BL by the sense amplifier SA only at the time of rewriting (or writing), the power consumption can be lowered when readout data and write data are different from each other.

Further, the sense amplifier SA is not limited to the latch-type amplifier used in the above embodiment, but a differential type amplifier for comparing a bit line potential with a reference potential may be used and the rewrite potential may be set on the bit line BL or /BL by use of a write circuit (not shown) based on the sense output of the differential type amplifier.

In the DRAM, for example, if a column shift register for sequentially outputting column selection signals CSL0 to CSLn as shown in FIG. 14A is additionally provided to sequentially select all of the columns in the memory cell array and access is made such that the head address is returned by one address number each time the column selection process is proceeded by one column, readout bits of all of the columns can be sequentially read out.

Further, by using a column decoder for decoding a column address as shown in FIG. 14B in stead of the column shift register shown in FIG. 14A, column selection signals CSL0 to CSLn can be sequentially output.

In the above DRAM, the random accessibility and access time are limited to some extent, but the perfect random accessibility can be attained by designing the DRAM of ×4 bit configuration for converting readout 4-bit bit data into parallel data. Further, in a case where the memory cell array is divided into a plurality of sub-arrays and only some (two or four, for example) of the plurality of sub-arrays are simultaneously activated for reduction in the power consumption, a DRAM of ×8 bit configuration or ×16 bit configuration can be attained by the serial/parallel conversion.

Figure 1B:
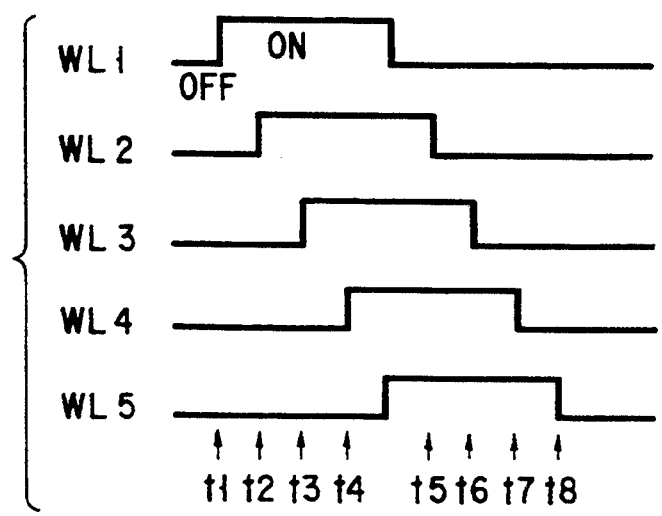
FIG. 1B is a timing waveform diagram showing one example of the readout operation and write operation of the memory cell of FIG. 1A.

In the cascade-connected type DRAM cell used in the above embodiment, the other ends of the capacitors C1 to C4 are commonly connected to the capacitor plate potential VPL, but the other ends of the capacitors C1 to C4 may be commonly connected to the power source potential vcc or ground potential Vss given from the exterior, and the technique for driving the capacitor plate by a clock disclosed in IEEE JOURNAL OF SOLID-STATE CIRCUITS VOL. SC-17, NO. 5, p. 872 OCTOBER 1982 'A Storage-Node-Boosted RAM with World-Line Delay Compensation' may be used. Also, the technique for connecting transfer gates to both ends of the capacitor disclosed in 1989 Symposium of VLSI Circuits, Digest of Tech. Papers, pp. 101-102 'A Novel Memory Cell Architecture for High-Density DRAMs' FIG. 1(b) may be used.

This invention is not limited to the above embodiments described in the specification with reference to the accompanying drawings and this invention can be modified without departing from the technical scope thereof and within the technical scope of the claims.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A DRAM comprising:
   a memory cell array having cascade-connected type memory cells arranged in a matrix form and each capable of storing plural-bit information in the unit of bit, word lines each commonly connected to the memory cells of the same row, and bit lines each commonly connected to the memory cells of the same column;
   sense amplifiers each arranged for a preset number of columns in said memory cell array and disposed in the central portion of said bit lines of said preset number of columns in the arrangement direction;
   first and second switching circuits disposed on both sides of each of said sense amplifiers, for electrically and selectively connecting said preset number of columns to said sense amplifier;
   an address designation circuit for separately and serially designating addresses of a plurality of memory cells disposed on both sides of said sense amplifier in the same column of said memory cell array;
   a word line driving circuit for selectively driving a word line connected to a memory cell of an address designated by said address designation circuit;
   a column selection circuit for effecting the column selection of said memory cell array; and
   an access control circuit for time-serially reading out plural-bit information from one of said memory cells storing storage information and lying on one side of said sense amplifier and sequentially rewriting the plural-bit information into one of the memory cells lying on the other side of said sense amplifier and set in a non-use state at the time of serial access to a plurality of memory cells in a desired column of said memory cell array.

2. A DRAM according to claim 1, further comprising:
   a first dummy cell circuit for creating a sense reference potential of said sense amplifier at the time of readout from the memory cell disposed on one side of said sense amplifier;
   a first dummy word line for selecting said first dummy cell circuit;
   a second dummy cell circuit for creating a sense reference potential of said sense amplifier at the time of readout from the memory cell disposed on the other side of said sense amplifier;
   a second dummy word line for selecting said second dummy cell circuit;
   a first common bit line for connecting a first input node which is one of the paired input nodes of said sense amplifier to said first switching circuit;
   a second common bit line for connecting a second input node which is the other of the paired input nodes of said sense amplifier to said second switching circuit; and
   a bit line precharge circuit for precharging said first and second common bit lines to a preset potential at a preset timing.

3. A DRAM according to claim 1, wherein said access control circuit effects the control operation to sequentially select said preset number of columns and commonly use said sense amplifier for said preset number of columns at the time of serial access to a plurality of memory cells in said preset number of columns.

4. A DRAM according to, claim 1, wherein said memory cell includes a cascade gate connected at a first end portion to said bit line and formed of a plurality of MOS transistors cascade-connected and a plurality of information storage capacitors each connected at one end to that one of the two ends of a corresponding one of said MOS transistors which lies in a position farther from said first end portion, the gates of said plurality of MOS transistors being connected to different word lines.

5. A DRAM according to claim 4, wherein a plurality of memory cells disposed on both sides of said sense amplifier for said preset number of columns include n memory cells for storing successive block data items and one memory cell into which the block data item is first written in the serial access.

6. A DRAM according to claim 4, wherein said access control circuit effects the control operation to sequentially effect the operation of reading/rewriting plural-bit information with respect to two memory cells in a desired column in the unit of two memory cells of a different combination of readout cell and rewrite cell, and sequentially read out successive block data items stored in 2n memory cells by a single serial access to 2(n+1) memory cells in said desired column, and at the same time, rewrite the block data into 2n memory cells including one memory cell which has been set in the non-use state before the readout operation.

7. A DRAM according to claim 6, wherein said access control circuit has a function of alternately changing the head address of a memory cell from which a next access is started from one side to the other side of said sense amplifier for each serial access and shifting the head address by one address number.

8. A DRAM according to claim 7, wherein said access control circuit includes a flag circuit for indicating that the serial access is the odd numbered or even numbered serial access and determines whether the head address of a memory cell from which access is started lies on one side or the other side of said sense amplifier by referring to said flag circuit for each serial access.

9. A DRAM according to claim 7, further comprising:
a flag circuit for indicating that the order of plural-bit data read out from the memory cell is set in the original order or inverted order according as whether the serial access is the odd numbered or even numbered serial access; and
a correction circuit for referring to said flag circuit for each serial access and correcting the order of the plural-bit data when the order of the plural-bit data read out from said memory cell is set in the inverted order.

10. A DRAM according to claim 4, wherein said address designation circuit includes a first address designation circuit for serially effecting the row address designating operation with respect to a plurality of memory cells in the same column on one side of said sense amplifier and a second address designation circuit for serially effecting the row address designating operation with respect to a plurality of memory cells in the same column on the other side of said sense amplifier, and said word line driving circuit includes first word line driving circuits controlled and selected by an output of said first address designation circuit and second word line driving circuits controlled and selected by an output of said second address designation circuit.

11. A DRAM according to claim 10, wherein said first address designation circuit is constructed by a first shift register having stages of a number corresponding to 1/k (k is an integer) of the number of the word lines on one side of the sense amplifier of said memory cell array and said second address designation circuit is constructed by a second shift register having stages of a number corresponding to 1/k of the number of the word lines on the other side of the sense amplifier of said memory cell array, and each of groups which each include k first word line driving circuits is controlled and selected by an output of a corresponding stage of said first shift register and each of groups which each include k second word line driving circuits is controlled and selected by an output of a corresponding stage of said second shift register.

12. A DRAM according to claim 11, wherein outputs of the respective stages of said first shift register and outputs of the respective stages of said second shift register are; deviated from each other by a half cycle.

13. A DRAM according to claim 11, wherein said first word line driving circuits are sequentially driven for each group of k circuits and said second word line driving circuits are sequentially driven for each group of k circuits.

14. A DRAM according to claim 13, wherein the drive starting timing of one of the k circuits of each group of said first word line driving circuits which is first driven and the drive starting timing of one of the k circuits of each group of said second word line driving circuits which is first driven are deviated from each other by a half cycle of each stage output of said first shift register.

15. A DRAM according to claim 13, wherein the drive completion timing of one of the k circuits of each group of said first word line driving circuits which is first driven coincides with the drive starting timing of one of the k word line driving circuits which is finally driven and the drive completion timing of one of the k circuits of each group of said second word line driving circuits which is first driven coincides with the drive starting timing of one of the k word line driving circuits which is finally driven.

16. A DRAM according to claim 14, wherein the drive starting timing of one of the k circuits of each group of said first word line driving circuits which is first driven lags behind the drive completion timing of one of the k circuits of each group of said second word line driving circuits which is first driven, and the drive starting timing of one of the k circuits of each group of said second word line driving circuits which is first driven lags behind the drive completion timing of one of the k circuits of each group of said first word line driving circuits which is first driven.

17. A DRAM according to claim 2, wherein said bit line precharge circuit precharges said first and second common bit lines to the power source potential.

18. A DRAM according to claim 2, wherein said first dummy cell circuit is constructed by a coupling capacitor connected between said first common bit line and said first dummy word line and said second dummy cell circuit is constructed by a coupling capacitor connected between said second common bit line and said second dummy word line.

19. A DRAM according to claim 1, wherein said first and second switch circuits are constructed by transfer gates connected between said sense amplifier and the bit lines of the same column and the transfer gate among said transfer gates which is set in the ON state when a signal read out from said memory cell is transferred to said sense amplifier is set into the OFF state immediately after the above signal transfer.

20. A DRAM according to claim 1, further comprising a circuit for sequentially selecting all of the columns in said memory cell array.

* * * * *